US012677439B2

(12) United States Patent　　　　　(10) Patent No.:　US 12,677,439 B2
Varghese et al.　　　　　　　　　　　(45) Date of Patent:　　　　Jul. 7, 2026

(54) SEMICONDUCTOR DEVICES WITH SELECTIVELY DOPED GATE ELECTRODE STRUCTURE

(71) Applicant: Texas Instruments Incorporated, Dallas, TX (US)

(72) Inventors: Dhanoop Varghese, Plano, TX (US); Henry Litzmann Edwards, Garland, TX (US); Pinghai Hao, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 495 days.

(21) Appl. No.: 18/309,792

(22) Filed: Apr. 29, 2023

(65) Prior Publication Data

US 2024/0363748 A1　　　Oct. 31, 2024

(51) Int. Cl.
*H10D 30/65*　　　(2025.01)
*H10D 30/01*　　　(2025.01)
*H10D 62/10*　　　(2025.01)
*H10D 64/01*　　　(2025.01)
*H10D 64/27*　　　(2025.01)

(52) U.S. Cl.
CPC ......... *H10D 30/65* (2025.01); *H10D 30/0281* (2025.01); *H10D 62/116* (2025.01); *H10D 64/01* (2025.01); *H10D 64/519* (2025.01)

(58) Field of Classification Search
CPC ............. H10D 30/603; H10D 30/0221; H10D 64/516; H10D 64/671; H10D 30/65; H10D 30/0281; H10D 62/116; H10D 64/01; H10D 64/519
See application file for complete search history.

(56) References Cited

U.S. PATENT DOCUMENTS

| | | |
|---|---|---|
| 7,315,067 B2 | 1/2008 | Wang |
| 7,816,744 B2 | 10/2010 | Su |
| 2006/0001050 A1 | 1/2006 | Wang |

(Continued)

FOREIGN PATENT DOCUMENTS

| CN | 114242776 | * 3/2022 | ........... H10D 30/603 |
|---|---|---|---|
| CN | 114242776 A | 3/2022 | |

(Continued)

OTHER PUBLICATIONS

International Search Report for Corresponding Application No. PCT/US2024/020836, mailed Jul. 16, 2024.

*Primary Examiner* — Galina G Yushina

(74) *Attorney, Agent, or Firm* — Yudong Kim; Frank D. Cimino

(57) ABSTRACT

Semiconductor devices including selectively doped gate electrodes are described. The semiconductor device comprises a substrate including a body region and a drift region, a gate dielectric layer on the substrate, the gate dielectric layer extending over the body region and the drift region, and a field relief dielectric layer on the drift region, the field relief dielectric layer laterally abutting the gate dielectric layer at a location over the drift region. The semiconductor device also includes a gate electrode having an n-doped first portion, a p-doped second portion, and an n-doped third portion. The selectively doped second portion of the gate electrode is located over an intersection between the gate dielectric layer and the field relief dielectric layer.

20 Claims, 13 Drawing Sheets

(56) References Cited

U.S. PATENT DOCUMENTS

| | | | | |
|---|---|---|---|---|
| 2010/0006934 A1* | 1/2010 | Su | | H10D 30/603 |
| | | | | 257/341 |
| 2011/0108917 A1* | 5/2011 | Shima | | H10D 30/603 |
| | | | | 257/E29.256 |
| 2014/0264618 A1* | 9/2014 | Yu | | H10D 30/603 |
| | | | | 438/420 |
| 2022/0149186 A1* | 5/2022 | Edwards | | H10D 62/156 |

FOREIGN PATENT DOCUMENTS

| | | | | |
|---|---|---|---|---|
| JP | 2009212237 | * | 9/2009 | H10D 30/65 |
| JP | 5206028 B2 | | 6/2013 | |

* cited by examiner

SEMICONDUCTOR DEVICES WITH SELECTIVELY DOPED GATE ELECTRODE STRUCTURE

TECHNICAL FIELD

This disclosure relates to the field of microelectronic devices. More particularly, but not exclusively, this disclosure relates to semiconductor devices having selectively doped gate electrode structure.

BACKGROUND

Semiconductor components are being continually improved to reliably operate with smaller feature sizes. Fabricating semiconductor devices that have increasingly higher performance while meeting reliability specifications is challenging.

SUMMARY

This summary is provided to introduce a brief selection of disclosed concepts in a simplified form that are further described below in the detailed description including the drawings provided. This summary is not intended to limit the claimed subject matter's scope.

Disclosed examples include a semiconductor device with a selectively doped gate electrode structure. The semiconductor device comprises a substrate including a body region having a first conductivity type and a drift region having a second conductivity type opposite the first conductivity type; a gate dielectric layer on the substrate, the gate dielectric layer extending over the body region and the drift region; a field relief dielectric layer on the drift region, the field relief dielectric layer laterally abutting the gate dielectric layer at a location over the drift region; a gate electrode on the gate dielectric layer and the field relief dielectric layer, the gate electrode including; a first portion with the second conductivity type, and extending over the body region and a first part of the drift region; a second portion with the first conductivity type, abutting the first portion, and extending over a second part of the drift region and a first part of the field relief dielectric layer; and a third portion with the second conductivity type, abutting the second portion, and extending over a second part of the field relief dielectric layer. The semiconductor device also includes a source region disposed in the body region, the source region having the second conductivity type; and a drain region disposed in the drift region, the drain region having the second conductivity type.

DETAILED DESCRIPTION

Figure 1A:
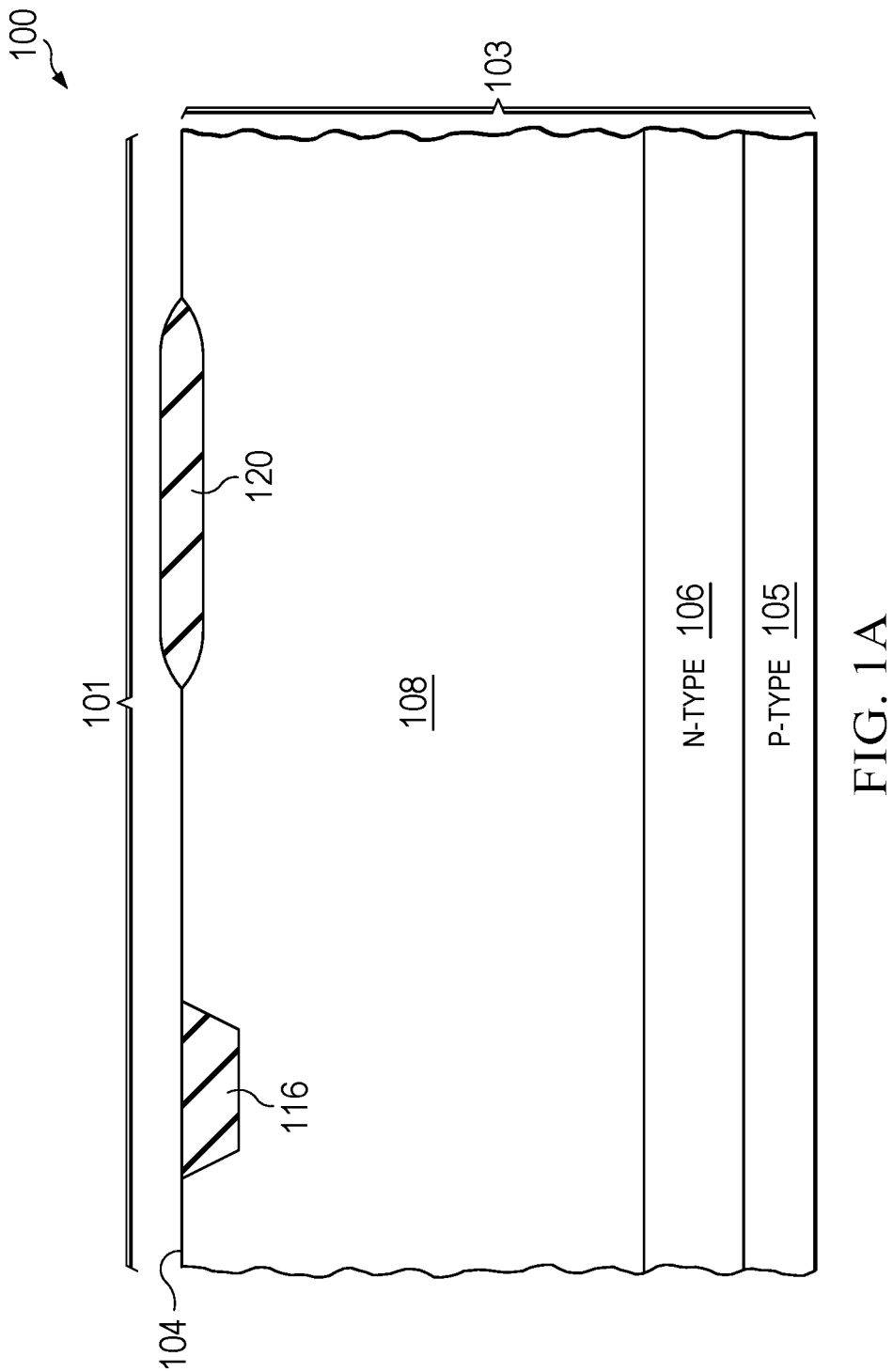
FIG. 1A through FIG. 1J are cross sections of an example microelectronic device including a transistor with a selectively doped gate electrode structure in various stages of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present disclosure is illustrated by embodiments directed to active devices, it is not intended that these illustrations be a limitation on the scope or applicability of the present disclosure. It is not intended that the active devices of the present disclosure be limited to the physical structures illustrated. These structures are included to demonstrate the utility and application of the present disclosure to presently preferred embodiments.

It is noted that terms such as top, bottom, over, above, and under may be used in this disclosure. These terms should not be construed as limiting the position or orientation of a structure or element, but should be used to provide spatial relationship between structures or elements. The terms "lateral" and "laterally" refer to directions parallel to a plane corresponding to a surface of a layer, for example a top surface of a semiconductor substrate. Moreover, the term "approximately," as used herein, may refer to ±5% to ±10% variations of the recited values in some cases. In other cases, the term "approximately" may refer to ±10% to ±20% variations of the recited values.

Semiconductor components or devices are being continually improved to reliably operate with smaller feature sizes. Fabricating such semiconductor components or devices satisfying area scaling and reliability requirements is challenging. Certain metal-oxide-semiconductor (MOS) transistors includes features for supporting high voltage operations— e.g., with a voltage applied to their drain (or drain structure) of about 20V, 30V, 40V, or even greater. Such MOS transistors may include drain diffusion profiles (or drain junction profiles) devised to support the high voltages applied to the drain—e.g., having an extended portion to distribute the voltage drop across wider areas. Accordingly, such MOS transistors may be referred to as drain-extended MOS transistors, for example drain-extended n-channel MOS (DENMOS) transistors, drain-extended p-channel MOS (DEPMOS) transistors, laterally-diffused MOS (LDMOS) transistors, as well as groups of DENMOS and DEPMOS transistors (which may be referred to as complimentary drain-extended MOS or DECMOS transistors).

Moreover, the drain-extended MOS (DEMOS) transistors include a field relief dielectric layer in addition to a gate dielectric layer such that the field relief dielectric layer can mitigate various undesirable impacts during the transistor operation in view of the high voltage applied to the drain—e.g., damaging the gate dielectric layer absent the field relief dielectric layer. As described in more detail herein, the field relief dielectric layer laterally abuts the gate dielectric layer and extends over a drift region (e.g., extended part(s) of the drain junction profile) of the DEMOS transistors. The DEMOS transistors include a gate (a gate electrode or a gate electrode structure) on the gate dielectric layer and the field relief dielectric layer to control current conduction in a channel (e.g., a semiconductor channel) between the drain and a source of the DEMOS transistors—e.g., turning on/off the DEMOS transistors. The gate (or the gate electrode structure) may include n-type polysilicon for DENMOS (or p-type polysilicon for DEPMOS). The transition region (e.g., intersection) between the gate dielectric layer and the field relief dielectric layer under the gate may correspond to a location where the electric field during the DEMOS transistor operation may reach its maximum. As such, the gate dielectric layer near (proximate or adjacent to) the intersection may be susceptible to various degradation mechanism(s).

For example, during the high voltage operation, the peak electric field at or near the transition region may generate electron-hole pairs in the drift region of the channel—e.g., through impact ionization. The electrons and holes may gain energy (e.g., getting "hot") under the electric field, which may be sufficient to overcome the energy barrier present between the gate dielectric layer and the drift region. Thus, at least some hot holes may be injected into the gate dielectric layer while the n-type polysilicon gate above the gate dielectric layer may inject electrons. When the holes and electrons recombine in the gate dielectric layer, each recombination event is estimated to release energy of approximately 9 eV, which is expected to accelerate the gate dielectric degradation rate (which may also be referred to as a gate oxide wear out). Such degradation of a gate dielectric layer may be represented as time dependent dielectric breakdown (TDDB) reliability—e.g., under the ON-state TDDB stress.

For the gate electrodes of the DEMOS transistors (e.g., the gate electrode structure extended across a gate oxide and a field relief oxide), it may be advantageous to use a selectively doped gate electrode to improve TDDB reliability characteristics. For example, in an n-channel DEMOS transistor, a portion of the n-type polysilicon gate may be selectively doped to become p-type polysilicon. Moreover, the p-doped portion covers the intersection of the gate dielectric layer and the field relief dielectric layer as well as portions of the gate dielectric layer and the field relief dielectric layer near (proximate, adjacent to) the intersection.

In this manner, when a DEMOS transistor operates under high voltage conditions, the p-type polysilicon having holes as majority carriers (and electrons as minority carriers) over the intersection may reduce electron injection into the gate dielectric layer such that, even with the presence of holes injected due to the hot-hole injection, the probability of having electron-hole recombination events can be reduced, thereby mitigating the gate dielectric degradation (e.g., gate oxide wear out)—e.g., improving the ON-state TDDB characteristics. In other words, by suppressing the electron-hole recombination mechanism in the gate dielectric layer near or at the intersection between the gate dielectric layer and the field relief dielectric layer, the TDDB characteristics of the gate dielectric layer may be improved.

Described examples include doped regions of various semiconductor structures which may be characterized as p-doped and/or n-doped regions or portions, and include regions that have majority dopants of a particular type, such as n-type dopants (providing electrons as charge carriers) or p-type dopants (providing holes as charge carriers). For the purposes of this description, doping of the first type may be n-type doping (n-doped, first conductivity type) and doping of the second type may be p-type doping (p-doped, second conductivity type).

FIG. 1A through FIG. 1J are cross sections of an example microelectronic device 100 including a DEMOS transistor 101 in successive stages of an example method of formation. The DEMOS transistor 101 may have a racetrack layout as described with reference to FIG. 2. Although the DEMOS transistor 101 described herein is an n-channel type (or an n-channel DEMOS), a p-channel type DEMOS transistor (or a p-channel DEMOS) can be formed in accordance with the present disclosure when n-doped regions are substituted by p-doped regions, and p-doped regions are substituted by n-doped regions.

FIG. 1A shows a cross section of a microelectronic device 100 including a substrate 103 after a shallow trench isolation (STI) structure 116 and a field relief dielectric layer 120 are formed. FIG. 1A also indicates an area for a DEMOS transistor 101. The substrate 103 includes a semiconductor material (e.g., silicon, germanium, or the like), and has a surface 104. The substrate 103 may be, for example, part of a bulk semiconductor wafer, part of a semiconductor wafer with an epitaxial layer, part of a silicon-on-insulator (SOI) wafer, or other structures suitable for forming the microelectronic device 100.

The substrate 103 may include an optional n-type buried layer (NBL) 106 on a p-type layer 105. The p-type layer 105 may be part of a bulk semiconductor wafer in which the microelectronic device 100 is formed, and may have a p-type dopant concentration between $1 \times 10^{18}$ atoms/cm$^3$ to $1 \times 10^{19}$ atoms/cm$^3$, for example. Alternatively, the p-type layer 105 may be lightly doped, with an average p-type dopant concentration less than $1 \times 10^{18}$ atoms/cm$^3$. The NBL 106 may be 2 microns to 10 microns thick, by way of example, and may have an n-type dopant (e.g., arsenic, antimony) concentration greater than $1 \times 10^{19}$ atoms/cm$^3$. The substrate 103 may include an epitaxial layer 108 on the NBL 106. The epitaxial layer 108 includes silicon. The epitaxial layer 108 may be regarded as part of the substrate 103, and may be 2 microns to 12 microns thick, for example. The epitaxial layer 108 may be p-type, with a dopant concentration of $1 \times 10^{15}$ atoms/cm$^3$ to $1 \times 10^{16}$ atoms/cm$^3$, by way of example. In versions of examples in which the substrate 103 lacks the NBL 106, the epitaxial layer 108 may be directly on the p-type layer 105.

The STI structure 116 may be formed by creating trenches in the substrate 103—e.g., etching part of the epitaxial layer 108 through an opening in a hardmask including a stack of a pad oxide and a nitride layers (not shown). Subsequently, the trenches may be filled by one or more dielectric materials—e.g., a high-density plasma (HDP) oxide. As described in more detail with reference to FIG. 1G through FIG. 1J, the STI structure 116 is positioned between the source region 154 and the back-gate region 162 of the DEMOS transistor 101.

The field relief dielectric layer 120 may be formed by a local oxidation of silicon (LOCOS) process—e.g., exposing the surface 104 of the substrate 103 (or the epitaxial layer 108) through an opening in a stack of a pad oxide and a nitride layers (not shown) to a thermal oxidation process that grows the field relief dielectric layer 120. The field relief dielectric layer 120 may have a thickness in a range between 50 nm and 150 nm. The field relief dielectric layer 120 may have a tapered edge along their perimeter where the field relief dielectric layer 120 adjoins the surface 104 of the substrate 103. The tapered edge of the field relief dielectric layer 120 may be referred to as a "bird's beak" region. As described in more detail with reference to FIG. 1J, the "bird's beak" region may develop relatively greater electric field during operations of the DEMOS transistor 101.

Figure 3:
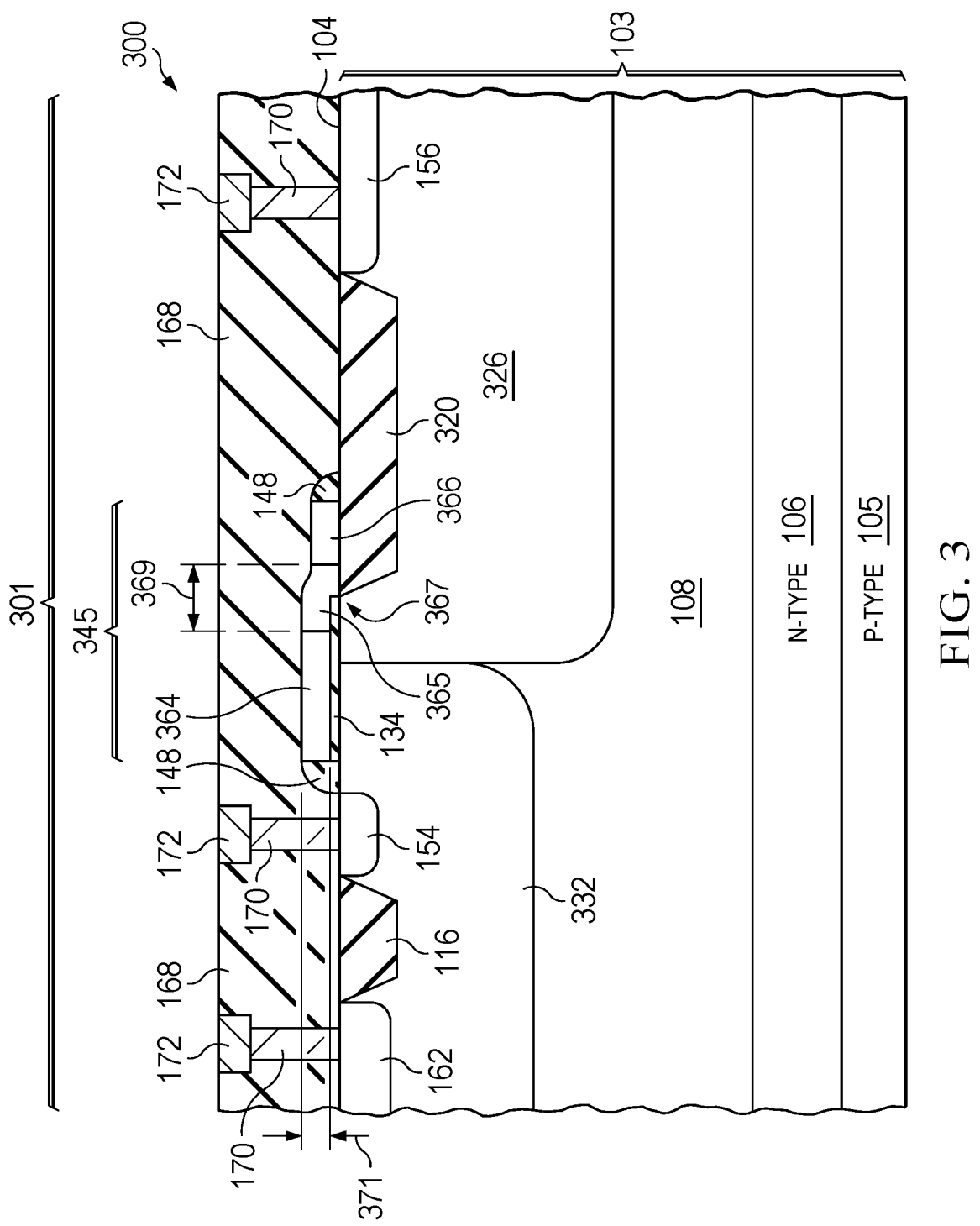
FIG. 3 is a cross section of an alternate example microelectronic device including a transistor with a selectively doped gate electrode structure.

Although the example DEMOS transistor 101 illustrated in FIGS. 1A-1J includes the STI structure 116 and the field relief dielectric layer 120, the present disclosure is not limited thereto. For example, as shown in FIG. 3, the field relief dielectric layer 120 may be replaced with another STI structure (e.g., the field relief dielectric layer 320 based on STI). Similarly, the STI structure 116 may be replaced with another LOCOS structure—e.g., similar to the field relief dielectric layer 120.

Figure 1B:
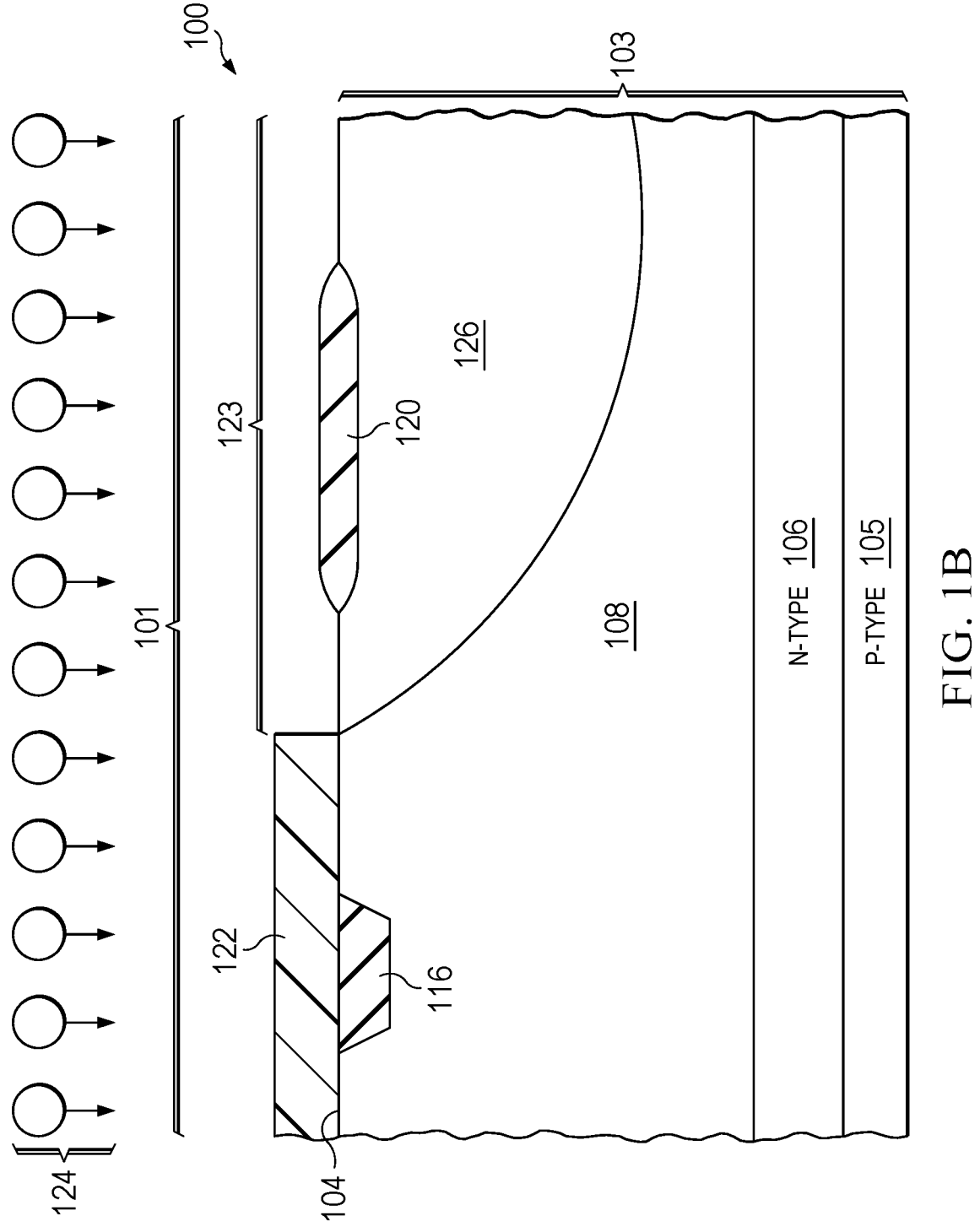

FIG. 1B shows a cross section after a n-drift resist 122 is deposited and patterned to form an n-drift resist opening 123. FIG. 1B also shows that one or more n-type implants 124 are performed to form a drift region 126 (which may be referred to as an n-drift region) in the exposed areas of the substrate 103. The n-type implants 124 to define the drift region 126 may occur in multiple steps. For example, phosphorus may be implanted at a total dose of between $1\times10^{12}$ cm$^{-2}$ and $1\times10^{13}$ cm$^{-2}$ with energies suitable for forming the drift region 126 with or without subsequent thermal cycles. Arsenic may also be implanted with a similar dose with an energy relatively less than the phosphorus implant. After the n-type implants 124, the n-drift resist 122 is removed.

Figure 1C:
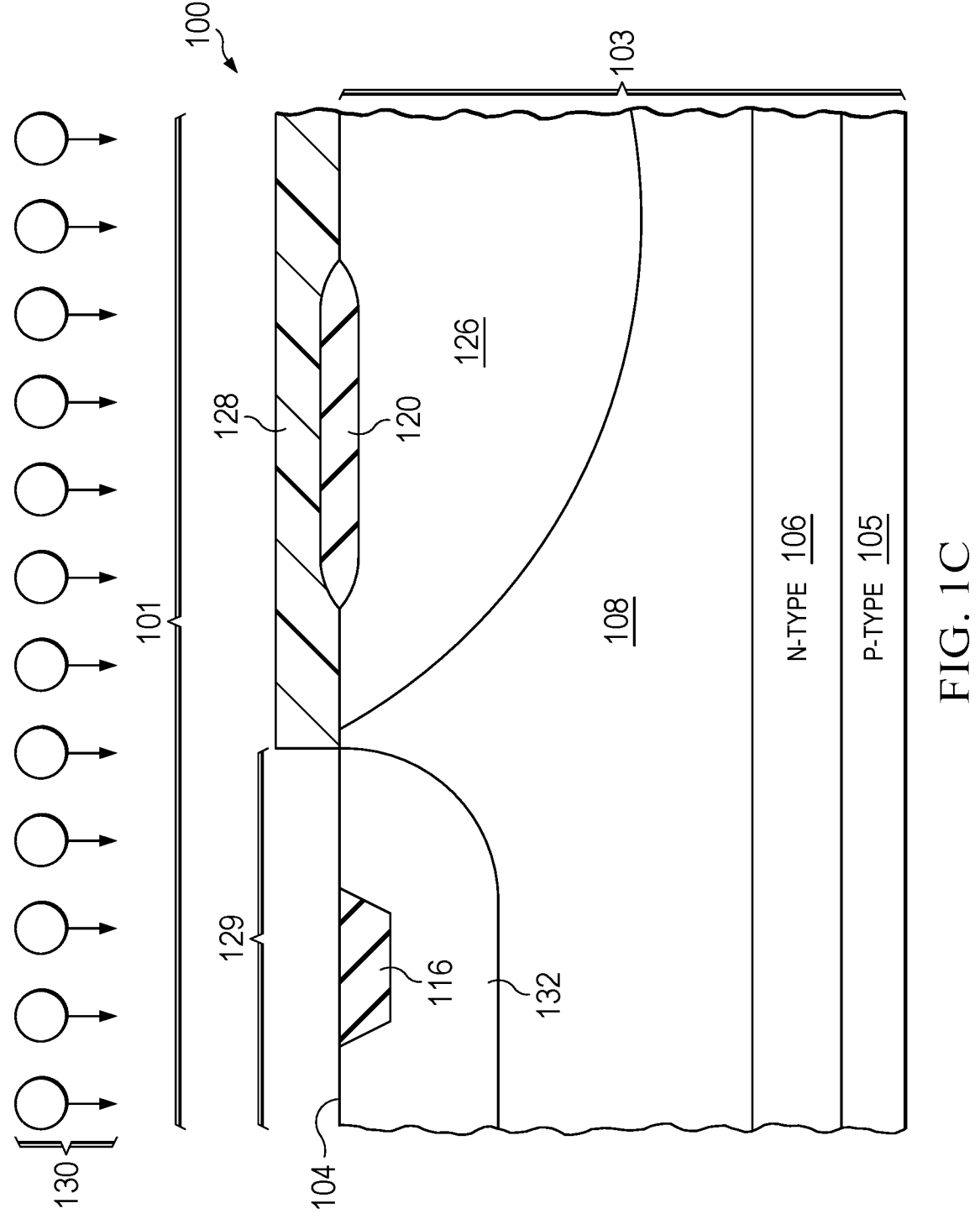

FIG. 1C shows a cross section after a p-type well resist 128 is deposited and patterned to form a p-type well resist opening 129. FIG. 1C also shows that a p-type implant 130 is performed to form a p-type well region 132 (which may be referred to as a p-well region). The p-type dopants implanted by the p-type implant 130 may include boron and/or indium. For example, a series of boron implants with an energy between 80 keV and 3 MeV, and doses between $4.0\times10^{12}$ cm$^{-2}$ to $1.5\times10^{14}$ cm$^{-2}$, with a tilt angle of less than 10 degrees may be used to implant the p-type well region 132. The p-type well region 132 (in conjunction with the epitaxial layer 108 in some examples) may be referred to a body region (e.g., p-type body region) of the DEMOS transistor 101. After the p-type implant 130, the p-type well resist 128 is removed. Subsequently, a thermal process may be used to activate dopants—e.g., dopants in the drift region 126, dopants in the p-type well region 132.

Figure 1D:
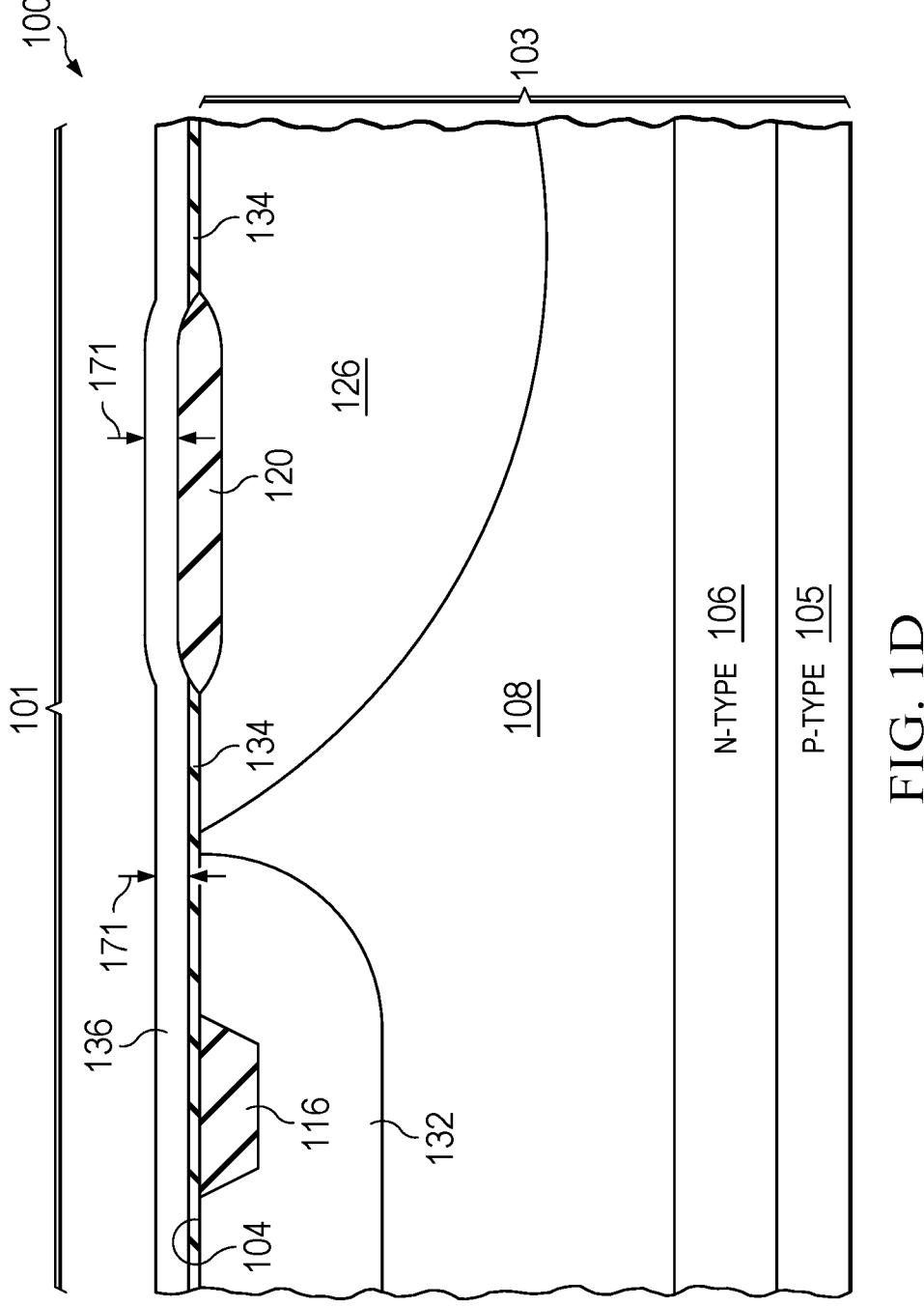

FIG. 1D shows a cross section after a gate dielectric layer 134 is formed. In some examples, the gate dielectric layer 134 is formed in a high temperature furnace operation or a rapid thermal process. In some examples, the gate dielectric layer 134 is grown on the surface 104 of the epitaxial layer 108. In some examples, the gate dielectric layer 134 is blanketly deposited across the substrate 103. A thickness of the gate dielectric layer 134 may range from approximately 3 nm to 15 nm for silicon dioxide or a silicon oxynitride (SiON) gate dielectric that may be slightly thinner but with a higher dielectric constant than that of silicon dioxide, which is about 3.9, by way of example.

Still referring to FIG. 1D, a gate layer 136 is formed on the gate dielectric layer 134. In some examples, the gate layer 136 is formed by a deposition process using one or more silane-based precursors to deposit polycrystalline silicon (which may be referred to as polysilicon). In other examples, a replacement gate process may be used to form the gate layer 136. The gate layer 136 in this example includes polycrystalline silicon, and may also be referred to as a gate polysilicon layer 136. The gate polysilicon layer 136 has a thickness 171 that may range from approximately 50 nm to 300 nm. Moreover, the gate polysilicon layer 136 may be undoped as-deposited. Subsequently, the gate polysilicon layer 136 will be selectively doped as described in more detail with reference to FIGS. 1G and 1H.

Figure 1E:
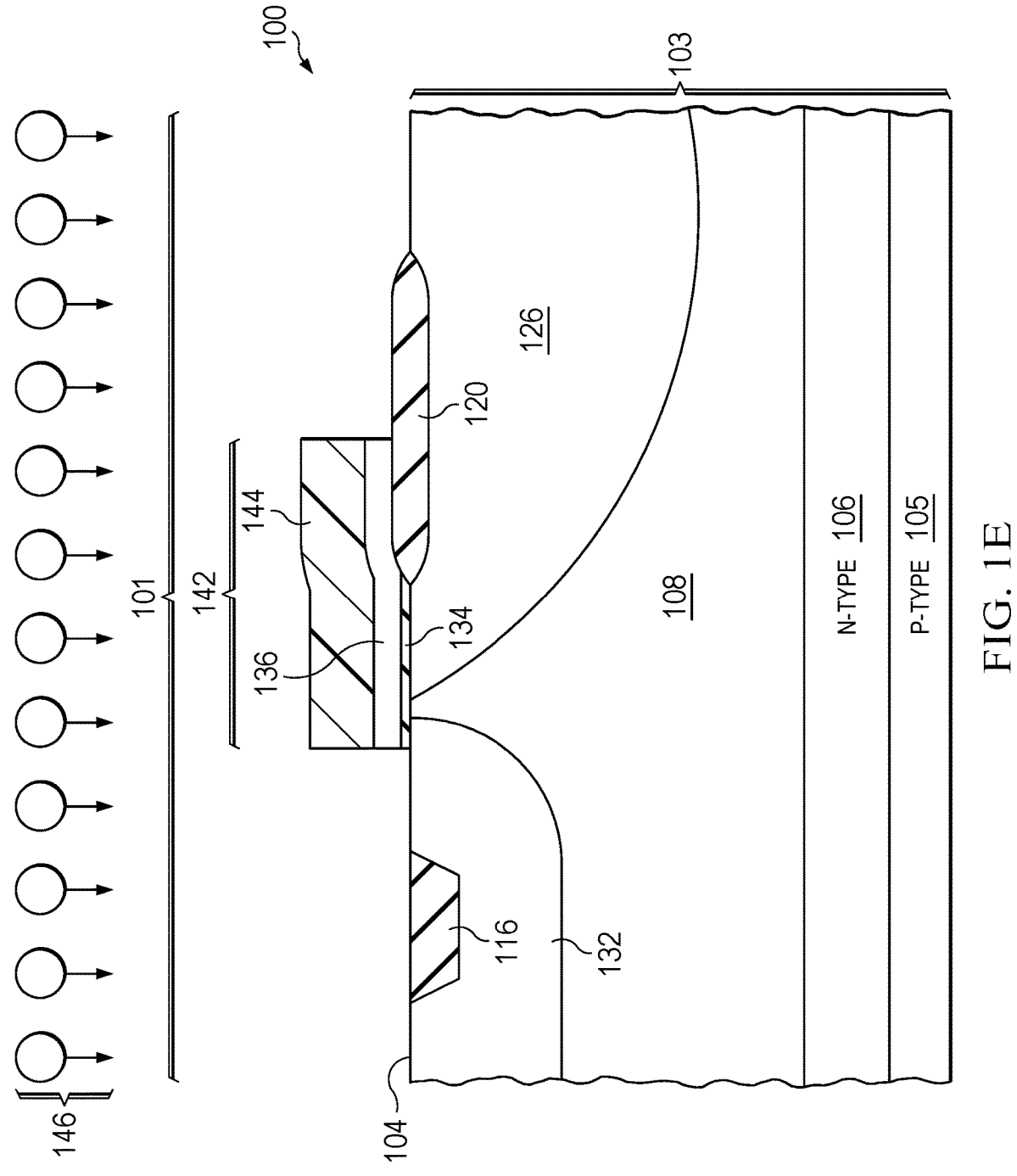

FIG. 1E shows a cross section after a gate resist 144 is deposited and patterned, and subsequently the gate dielectric layer 134 and the gate polysilicon layer 136 are patterned based on the gate resist 144 pattern. A gate plasma etch 146 is used to define a gate electrode 142. The gate electrode 142 may have a racetrack layout as described with reference to FIG. 2. After the gate plasma etch 146 is complete, the gate resist 144 is removed and a wet or dry process may be used to clean the wafer surface. As shown in FIG. 1E, the gate electrode 142 extends over part of the p-type well region 132, part of the epitaxial layer 108, and part of the drift region 126 of the DEMOS transistor 101. One end of the gate electrode 142 terminates over the field relief dielectric layer 120 while the opposite end of the gate electrode 142 terminates over the p-type well region 132—e.g., over a source-side n-doped region in the p-type well region 132, which is electrically connected to the source region 154 that forms later as depicted in FIG. 1G.

Figure 1F:
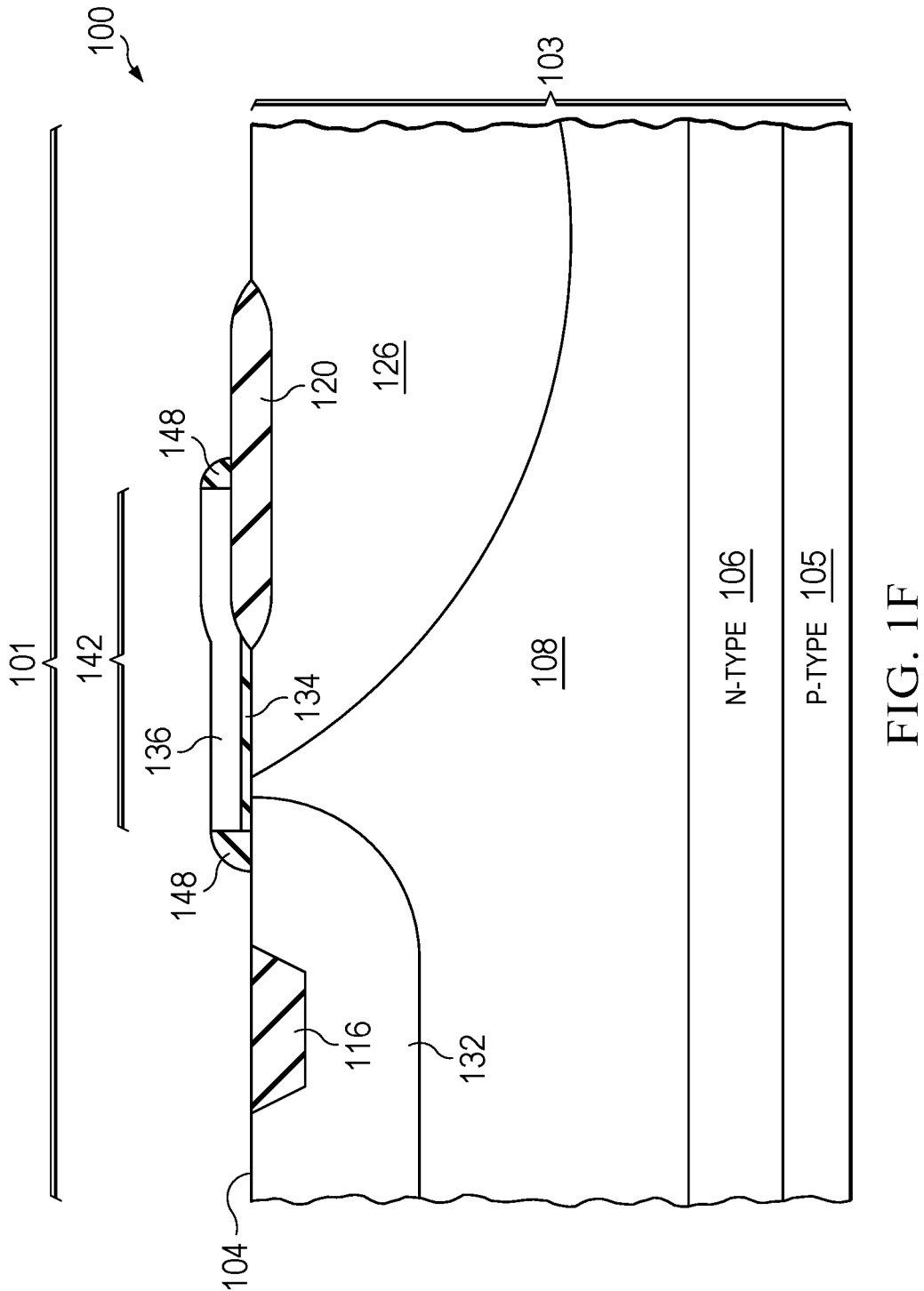

FIG. 1F shows that a spacer 148 formed on the lateral surfaces (e.g., sidewalls) of the gate electrode 142. The spacer 148 is formed by blanketly forming one or more conformal layers of a dielectric material over the substrate 103 and over the gate electrode 142. The dielectric material is subsequently removed from horizontal surfaces, that is, surfaces generally parallel to the surface 104 of the substrate 103, by an anisotropic etch process such as a reactive-ion etching (RIE) process, leaving the dielectric material on the lateral surfaces of the gate electrode 142. The spacer 148 may include dielectric materials such as silicon dioxide, silicon nitride, or both. The spacer 148 may extend 50 nanometers to 200 nanometers from the lateral edge of the gate electrode 142. Further, an n-type implant may be performed prior to forming the one or more conformal layers of the spacer 148. Such an implant forms a source-side n-doped region (not explicitly shown) that is coupled to the source region 154 that forms later as depicted in FIG. 1G. In this manner, the source region 154 (in conjunction with the source-side n-doped region underneath the spacer 148) can have an electrical overlap with the gate electrode 142.

Figure 1G:
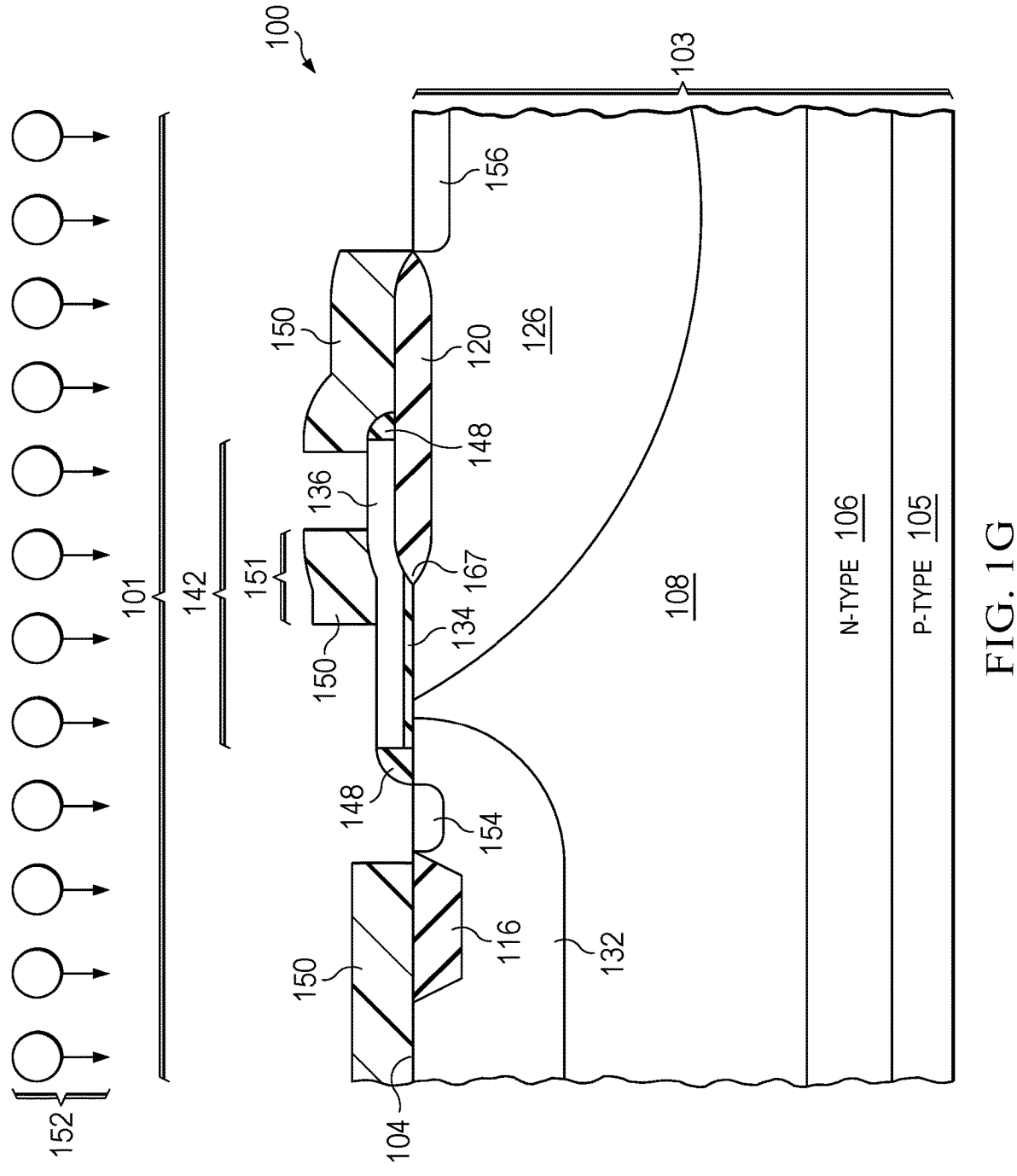

FIG. 1G shows a cross section after a source/drain resist 150 is deposited and patterned to form various openings for a subsequent source/drain implant 152. Some openings are devised to form a source region 154 and a drain region 156. Some openings are devised to selectively introduce n-type dopants of the source/drain implant 152 to portions of the gate polysilicon layer 136, which correspond to the first portion 164 and the third portion 166 of the gate electrode 142 described with reference to FIGS. 1H and 1I. Moreover, the patterned source/drain resist 150 covers a portion of the gate polysilicon layer 136 (as depicted by a segment 151 of the source/drain resist 150 that blocks the source/drain implant 152), which correspond to the second portion 165 of the gate electrode 142 described with reference to FIGS. 1H and 1I.

The patterned source/drain resist 150 is depicted to have an end over the STI structure 116 such that the opening for forming the source region 154 can overlap with the STI structure 116. Such an overlap may ensure the source/drain implant 152 to be done for the entire source region 154 despite statistical process variations present during the fabrication process—e.g., variations in critical dimensions, variations in lithographic registration performance. Similarly, the patterned source/drain resist 150 is depicted to have an end over the gate polysilicon layer 136. In this manner, the source/drain implant 152 is ensured not to overlap with the field relief dielectric layer 120 such that the n-type dopants of the source/drain implant 152 may not penetrate through the field relief dielectric layer 120 despite the process variations.

Still referring the FIG. 1G, the source/drain implant 152 implants n-type dopants into the source region 154 in the p-type well region 132 and the drain region 156 in the drift region 126. The source/drain implant 152 may occur in one or more steps with implant species including one or more of phosphorus and arsenic with an overall dose of between $5\times10^{13}$ cm$^{-2}$ and $4.5\times10^{15}$ cm$^{-2}$ and an energy between 2 keV and 80 keV. In some examples, the source/drain implant 152 is devised to provide degenerate doping to the source region 154 and the drain region 156—e.g., having an active average dopant density greater than $1\times10^{19}$/cm$^3$ near the solubility limit of the dopant atoms in the source region 154 and the drain region 156. The drain region 156 may have an average dopant density at least twice that of the drift region 126. The source region 154 may have an average dopant density at least twice that of the p-type well region 132. Although the source region 154 appears to be laterally separated from the edge of the gate electrode 142 as depicted in FIG. 1G, the source region 154 (in conjunction with the source-side n-doped region underneath the spacer 148) has an electrical overlap with the gate electrode 142 such that the source region 154 can be electrically coupled to the channel under the gate electrode 142. After the source/drain implant 152, the source/drain resist 150 is removed.

Figure 1H:
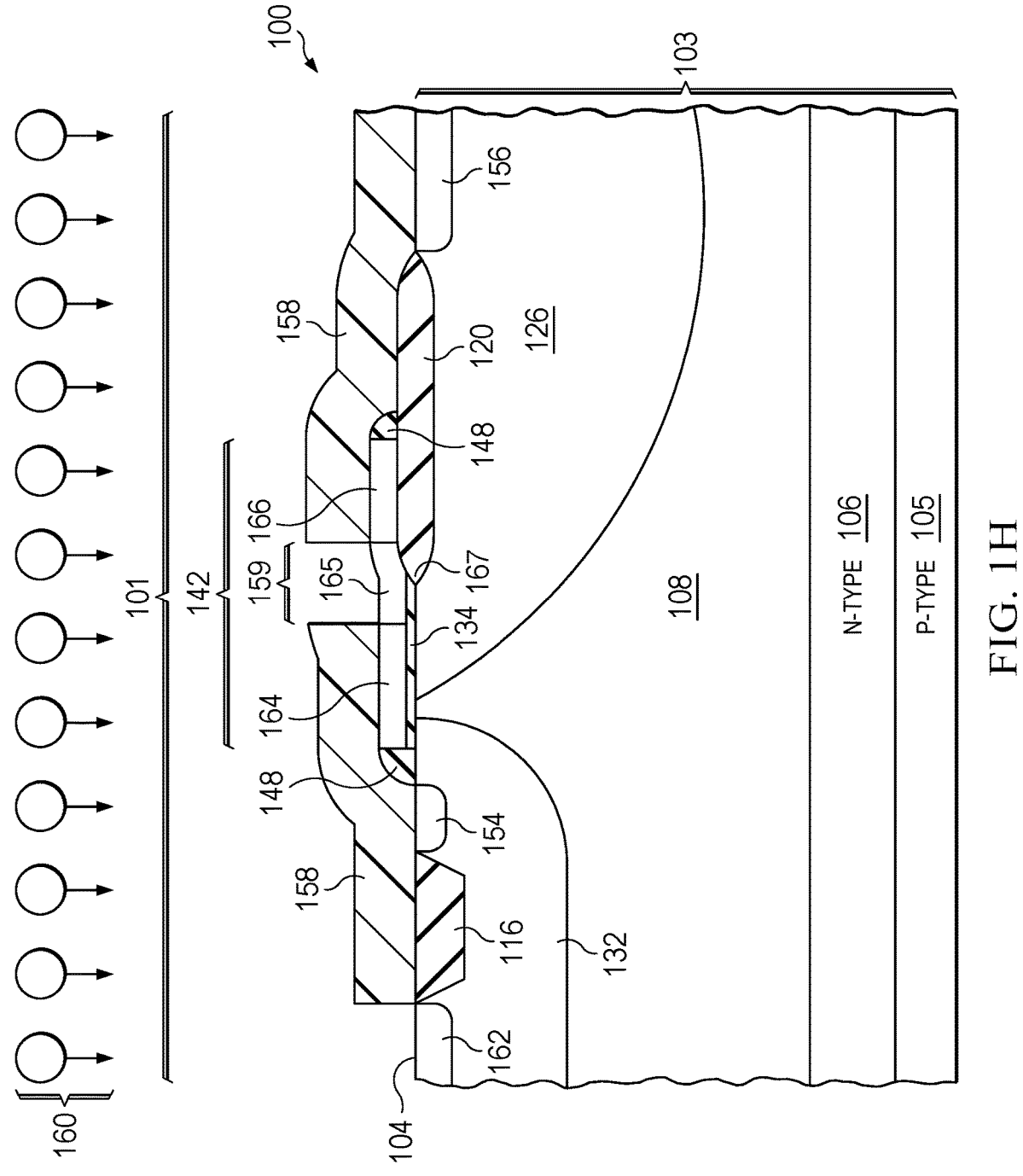

FIG. 1H shows a cross section after another source/drain resist 158 is deposited and patterned to form various openings for a subsequent source/drain implant 160. The source/drain implant 160 implants p-type dopants into source regions and drain regions of p-channel transistors (e.g., DEPMOS not shown) being concurrently formed in the substrate 103. As with the source/drain implant 152, the source/drain implant 160 may occur in one or more steps with implant species including boron (or indium) with an overall dose and energy suitable to provide degenerate doping to the source region and the drain region of the DEPMOS—e.g., having an active average dopant density greater than $1\times10^{19}$/cm$^3$ near the solubility limit of the dopant atoms in the source region and the drain region.

At least one opening of the patterned source/drain resist 158 is devised to form a back-gate region 162. The patterned source/drain resist 158 includes an opening 159 devised to selectively introduce the p-type dopants of the source/drain implant 160 into a portion of the gate polysilicon layer 136, which corresponds to the second portion 165 of the gate electrode 142. The source/drain implant 160 implants one or more p-type dopants in the back-gate region 162 and in the second portion 165 of the gate electrode 142. The back-gate region 162 is electrically isolated and separated from the source region 154. The back-gate region 162, however, is electrically coupled to the p-type well region 132 and to the epitaxial layer 108.

As a result of the source/drain implant 160, the second portion 165 of the gate electrode 142 becomes p-type doped—e.g., degenerately doped having an active average dopant density greater than $1\times10^{19}$/cm$^3$. A first portion 164 of the gate electrode 142 remains n-type doped. A third portion 166 of the gate electrode 142 also remains n-type doped. In other words, the second portion 165 of the gate electrode 142 is selectively doped to become oppositely doped as compared to the remaining portions of the gate electrode 142. The second portion 165 of the gate electrode 142 has a center approximately corresponding to the intersection between the gate dielectric layer 134 and the field relief dielectric layer 120 (e.g., at the bird's beak region or thereabout), which is located in the drift region 126. Stated differently, the second portion 165 of the gate electrode 142 may be regarded to have two halves conjoined at the center with a first half abutting the first portion 164 of the gate electrode 142 (e.g., the left half of the second portion 165 as depicted in FIG. 1H) and a second half abutting the third portion 166 of the gate electrode 142 (e.g., the right half of the second portion 165 as depicted in FIG. 1H). Accordingly, the center is positioned between the first portion 164 of the gate electrode 142 and the third portion 166 of the gate electrode 142.

Although FIG. 1H illustrates the second portion 165 of the gate electrode 142 receiving the same implant (e.g., the source/drain implant 160) as the back-gate region 162 by sharing common process steps (e.g., the source/drain resist 158 and the source/drain implant 160), the present disclosure is not limited thereto. For example, the second portion 165 of the gate electrode 142 may receive additional p-type implants (e.g., in addition to the source/drain implant 160) through additional photolithography steps opening the second portion 165 of the gate electrode 142. In some examples, the second portion 165 of the gate electrode 142 may receive p-type implants independent of the source/drain implant 160 through additional photolithography steps defining the second portion 165 of the gate electrode 142, which covers the back-gate region 162.

Figure 1I:
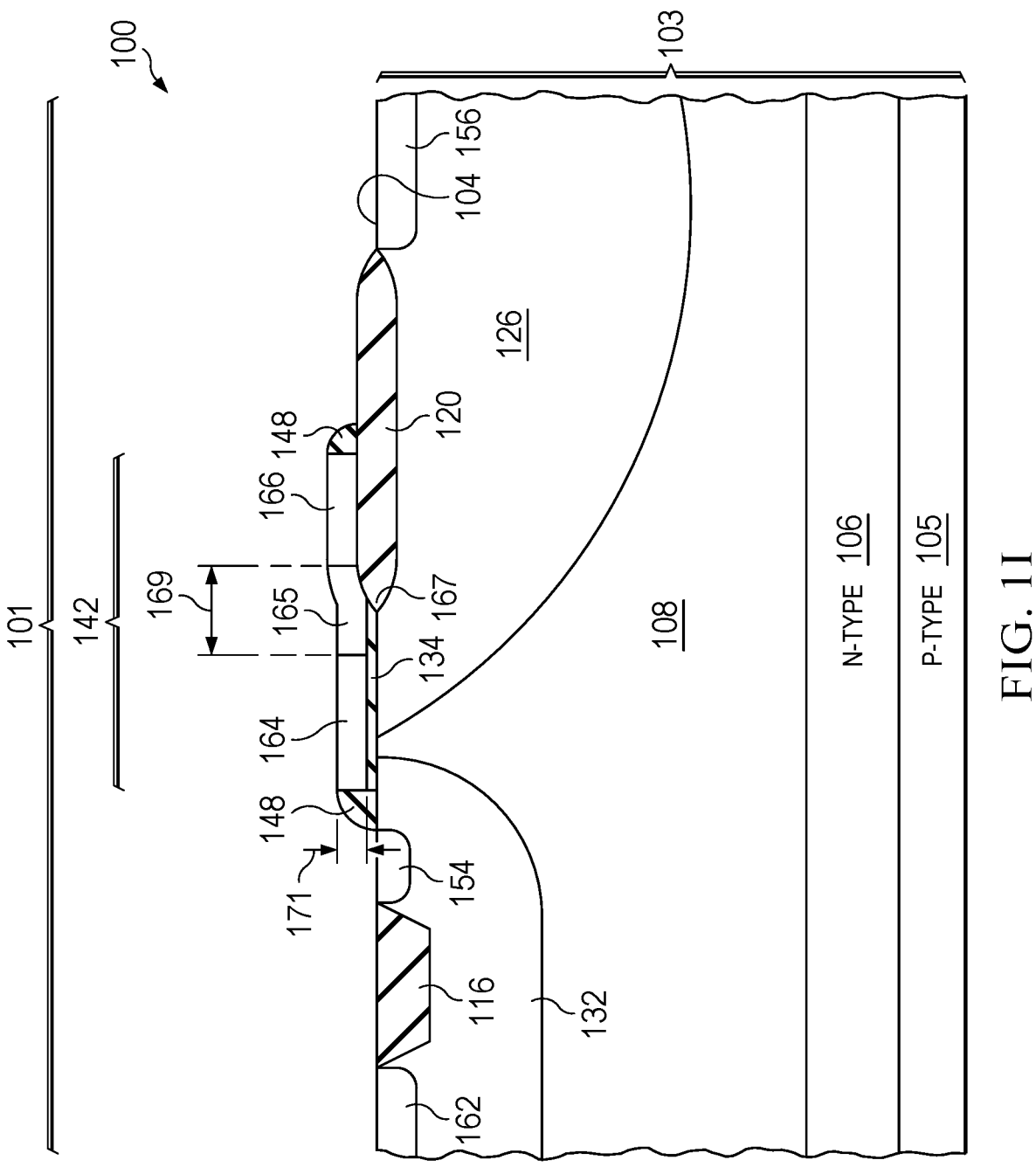

FIG. 1I shows a cross section of the DEMOS transistor 101 after the back-gate resist 158 is removed. As described with reference to FIG. 1H, the selective doping of the gate electrode 142 results in a first portion 164 which is n-type, a second portion 165 abutting the first portion 164, which is p-type, and a third portion 166 abutting the second portion 165, which is n-type. The second portion 165 of the gate electrode 142 (e.g., the oppositely doped section of the gate electrode 142) has a width 169. The width 169 corresponds to a distance between the first portion 164 and the third portion 166 of the gate electrode 142. Moreover, a footprint of the second portion 165 is confined within the drift region 126—e.g., not extending into the p-type well region 132. In some examples, the width 169 of the second portion 165 is at least twice the thickness 171 of the gate polysilicon layer 136 (or the thickness of the gate electrode 142 including the gate polysilicon layer 136 and the gate dielectric layer 134). In some examples, the width 169 of the second portion 165 is greater than 300 nm. In some examples, the selective doping of the second portion 165 of the gate electrode 142 renders the second portion 165 degenerately doped. In other words, the second portion 165 of the gate electrode 142 has an average density of electrically active dopants (e.g., dopants contributing holes) greater than $1\times10^{19}$/cm$^3$.

The second portion 165 of the gate electrode 142 is over an intersection 167 where the gate dielectric layer 134 and the field relief dielectric layer 120 meet. In other words, a footprint of the second portion 165 includes the intersection 167. The intersection 167 is over the drift region 126. The intersection 167 (or thereabouts) may include a location for the electric field reaching its maximum during the DEMOS transistor operation. As described above, the strong electric field at or near the intersection 167 (e.g., "bird's beak"

region) may generate electron-hole pairs—e.g., in the drift region 126. In some cases, energetic holes ("hot" holes) may be injected from the drift region 126 into the gate dielectric layer 134. As such, the gate dielectric layer 134 near (proximate or adjacent to) the intersection 167 may be relatively more susceptible to the TDDB reliability issues when compared to the other areas of the gate dielectric layer 134.

Selectively doping the gate electrode 142 renders the second portion 165 of the gate electrode 142 over the intersection 167 a p-type—e.g., degenerately p-type doped. When the DEMOS transistor 101 operates under the high voltage conditions (and hot holes are injected into the gate dielectric layer 134), the p-type doped second portion 165 over the intersection 167 (and near the intersection 167) is expected to reduce electron-hole recombination within the gate dielectric layer 134 in view of the electrons being a minority carrier in the p-type doped second portion 165. In this manner, the p-type doped second portion 165 may suppress electron and hole recombination in the gate dielectric layer 134, and a gate oxide wear out mechanism may be ameliorated as a result. In other words, by reducing the probability of having electron-hole recombination events in the gate dielectric layer 134 near the intersection 167, the TDDB characteristics of the gate dielectric layer 134 may be improved.

Figure 1J:
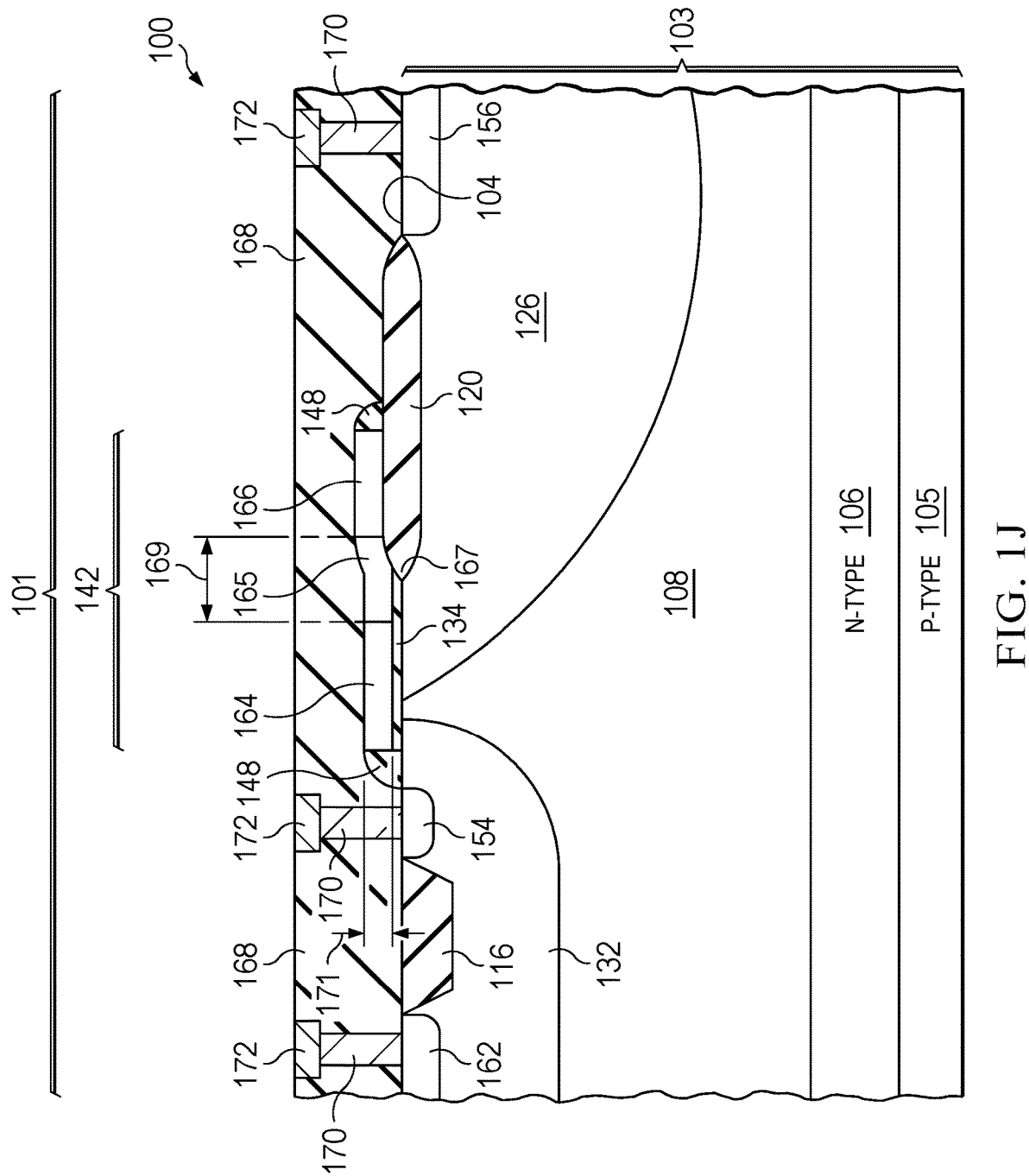

FIG. 1J shows a cross section of the DEMOS transistor 101 after a first level of interconnects 172 is complete. In some examples, a metal silicide layer (not specifically shown) may be formed on exposed areas of the surface 104 of the substrate 103. A pre-metal dielectric (PMD) layer 168 is formed over the surface 104 of the substrate 103. The PMD layer 168 may include one or more dielectric layers, such as silicon nitride, silicon oxynitride, silicon dioxide, or the like. In some examples, the PMD layer 168 includes a PMD liner and a main dielectric sublayer formed on the PMD liner. Subsequently, the PMD layer 168 may be planarized by a chemical mechanical polish (CMP) process.

Contacts 170 through the PMD layer 168 may be formed. The contacts 170 may be formed by patterning and etching holes through the PMD layer 168. Contacts 170 may be filled by sputtering titanium to form a titanium adhesion layer, followed by forming a titanium nitride diffusion barrier. A tungsten core may then be formed by a process using tungsten hexafluoride ($WF_6$). The tungsten, titanium nitride, and titanium are subsequently removed from a top surface of the PMD layer 168 by a plasma etch process, a tungsten CMP process, or a combination of both, leaving the contacts 170 extending to the top surface of the PMD layer 168.

Interconnects 172 may be formed on the contacts 170. The contacts 170 and interconnects 172 provide electrical contact between the DEMOS transistor 101 and other components of the microelectronic device 100. In versions of this example in which the interconnects 172 have an etched aluminum structure, the interconnects 172 may be formed by depositing an adhesion layer, an aluminum layer, and an anti-reflection layer, and forming an etch mask (not explicitly shown) followed by an RIE process to etch the anti-reflection layer, the aluminum layer, and the adhesion layer where exposed by the etch mask, and subsequently removing the etch mask.

In versions of this example in which the interconnects 172 have a damascene structure, the interconnects 172 may be formed by forming an inter-metal dielectric (IMD) layer (not specifically shown) on the PMD layer 168, and etching interconnect trenches through the IMD layer to expose the contacts 170. The interconnect trenches may be filled with a barrier liner and copper. The copper and barrier liner may be subsequently removed from a top surface of the IMD layer by a copper CMP process.

Figure 2:
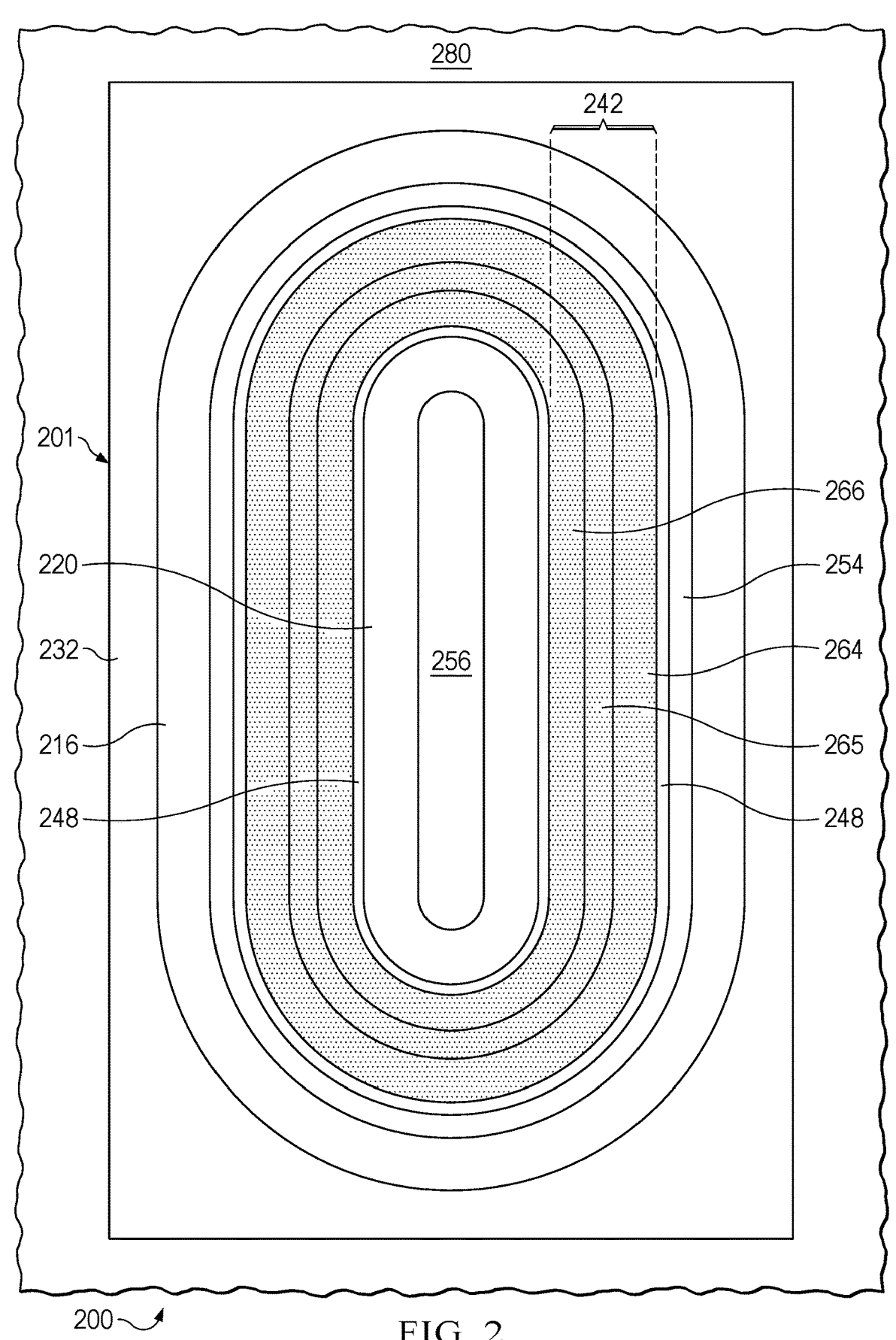
FIG. 2 is a top-down view of an example microelectronic device including a transistor with a selectively doped gate electrode structure.

FIG. 2 is a top-down view of a microelectronic device 200 including a DEMOS transistor 202 in a racetrack configuration—e.g., a racetrack layout generally having dimensions greater in a first orientation than in a second orientation perpendicular to the first orientation (or generally rectangular layouts with rounded corners). The DEMOS transistor 202 includes aspects of the DEMOS transistor 101 described with reference to FIGS. 1A through 1I. For example, the DEMOS transistor 202 includes a gate electrode 242 with a selectively doped portion. Moreover, the DEMOS transistor 202 has a gate electrode 242 (which includes aspects of the gate electrode 142) in a racetrack configuration. The gate electrode 242 includes a first portion 264 which is of the first conductivity type (e.g., n-type), a second portion 265 which is of the second conductivity type (e.g., p-type), and a third portion 266 which is of the first conductivity type (e.g., n-type). As shown in FIG. 2, the gate electrode 242 surrounds a drain region 256 (which includes aspects of the drain region 156). Moreover, a source region 254 (which includes aspects of the source region 154) surrounds the gate electrode 242.

As with the DEMOS transistor 101, the gate electrode 242 extends between the source region 254 and the drain region 256, and the second portion 265 of the gate electrode 242 extends over an intersection between a gate dielectric layer and a field relief layer of the DEMOS transistor 202 (not explicitly shown) such that the gate dielectric layer may be less prone to suffer from a wear out mechanism—e.g., ON-state TDDB stress. Other elements of the DEMOS transistor 202 include a drift region 220 (which includes aspects of the drift region 126, without explicitly showing the portion extended under the gate electrode 242), an STI structure 216 (which includes aspects of the STI structure 116), a p-type well region 232 (which includes aspects of the p-type well region 132, without explicitly showing the portion extended under the gate electrode 242), a spacer 248 (which includes aspects of the spacer 148) around the gate electrode 242, and an isolation region 280 configured to provide isolation for the DEMOS transistor 202—e.g., suppressing noise propagation through the substrate 103.

FIG. 3 is a cross section of an alternative microelectronic device 300 including a DEMOS transistor 301 with a selectively doped gated electrode structure. The DEMOS transistor 301 includes aspects of the DEMOS transistors 101 and 202 described with reference to FIGS. 1A through 1J and FIG. 2. For example, the DEMOS transistor 301 includes a gate electrode 345 (which includes aspects of the gate electrode 142) with a selectively doped portion. The DEMOS transistor 301 differs from the DEMOS transistors 101 in that the field relief dielectric layer 320 utilizes an STI structure instead of a LOCOS structure. Moreover, a p-well region 332 (which includes aspects of the p-type well region 132) is illustrated to abut a drift region 326 (which includes aspects of the drift region 126) although the present disclosure is not limited thereto. For example, the p-well region 332 may be spaced apart from the drift region 326 such that the epitaxial layer 108 may extend therebetween to the surface 104 of the substrate 103.

As the field relief dielectric layer 320 provides a relatively flat surface topography (e.g., when compared to the field relief dielectric layer 320), the gate electrode 345 has a relatively even surface profile (e.g., when compared to the gate electrode 142). In the example DEMOS transistor 301, a first portion 364 of the gate electrode 345, which is of the first conductivity type, is located nearer to the source region 154 (e.g., when compared to other portions of the gate electrode 345). Moreover, the first portion 364 of the gate electrode 345 extends over a portion of the p-well region 332 and a portion of the drift region 326. A second portion 365 of the gate electrode 345, which is of the second conductivity type opposite the first conductivity type, abuts the first portion 364 and a third portion 366 of the gate electrode 345. The second portion 365 of the gate electrode 345 is over the intersection 367 between the gate dielectric layer 134 and the field relief dielectric layer 320. Moreover, a footprint of the second portion 365 is confined within the drift region 326—e.g., not extending into the p-well region 332. In some examples, the second portion 365 has a width 369 that is at least twice the thickness 371 of the gate polysilicon layer of the gate electrode 345 (or the thickness of the gate electrode 345 including the gate polysilicon layer and the gate dielectric layer 134). In some examples, the width 369 may be greater than 300 nm. The third portion 366 of the gate electrode 345 is of the first conductivity type and is over the field relief dielectric layer 320.

Figure 4:
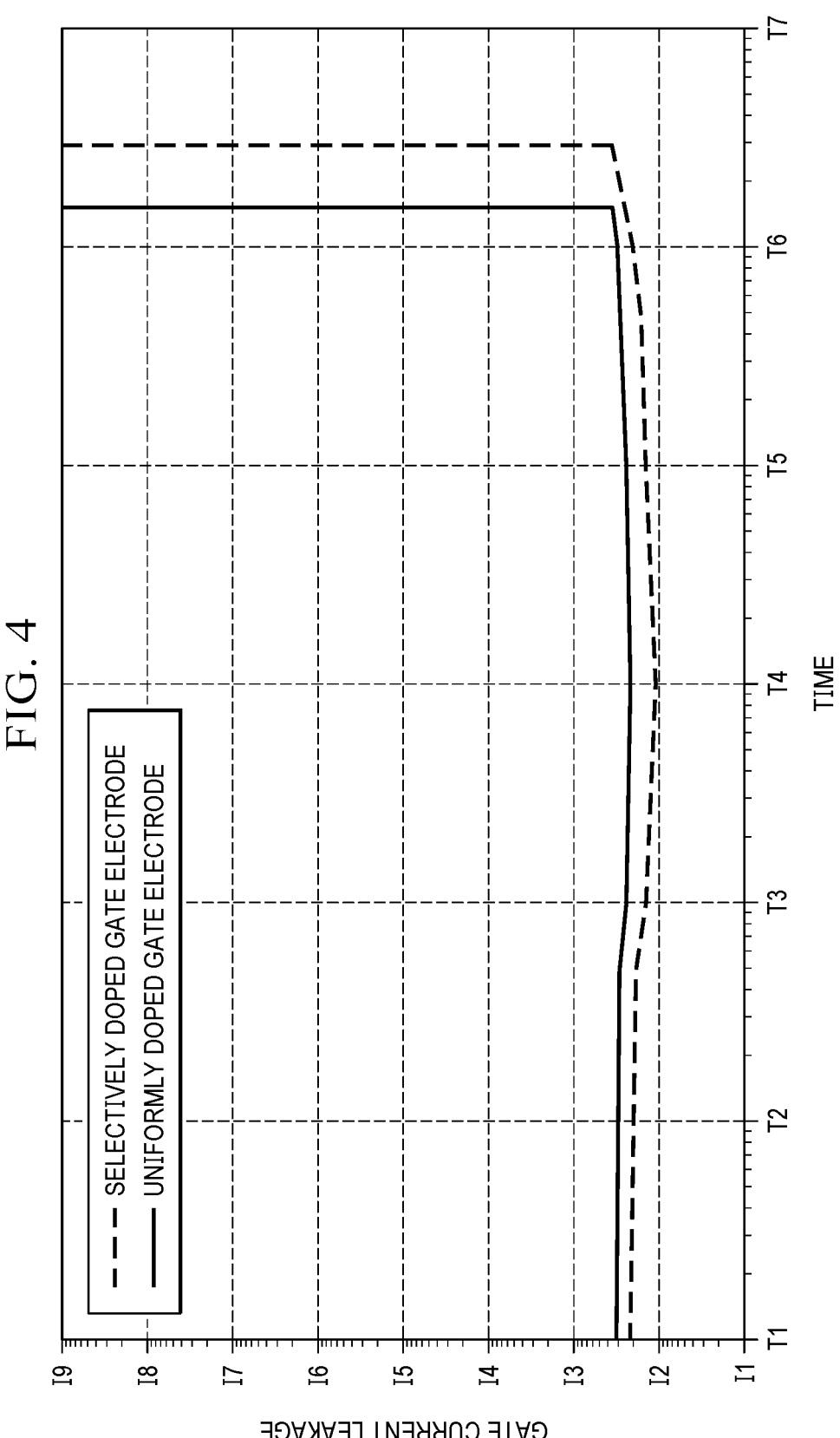
FIG. 4 is a graph of time dependent dielectric breakdown (TDDB) reliability data from a transistor with a uniformly doped gate electrode structure and a transistor with a selectively doped gate electrode structure.

FIG. 4 is a graph of TDDB reliability data from a transistor with a uniformly doped gate electrode structure and a transistor with a selectively doped gate electrode structure—e.g., the DEMOS transistors 101, 201, and 301 described with reference to FIGS. 1A through 3. The vertical axis of the graph is a log function representation of the gate leakage current in an arbitrary unit. The horizontal axis of the graph is a log function representation of time in an arbitrary unit during which the transistors are subject to reliability stress—e.g., the ON-state TDDB stress. Abrupt increase in the gate leakage current is an indication that a gate oxide (e.g., the gate dielectric layer 134) is severely degraded during the stress. Due to the nature of the log representation of the time, the time to failure seem similar between the two transistors, but the time to failure for the transistor with a selectively doped gate electrode structure is approximately twice the time to failure for the transistor with a uniformly doped gate electrode structure. This represents a significant improvement in the gate dielectric reliability as a result of having a selectively doped gate electrode structure in accordance with the present disclosure. Moreover, in view of the selective gate doping taking place utilizing the existing source/drain implant mask and the source/drain implant (e.g., the source/drain resist 158, the source/drain implant 160), the improvement comes with no increased mask requirements or additional processing steps compared to the DEMOS transistor with a uniformly doped gate electrode structure.

While various embodiments of the present disclosure have been described above, it should be understood that they have been presented by way of example only and not limitation. As such, although foregoing examples are described to use various resist layers (e.g., photoresist or photomask layers) to perform various process steps (e.g., implant steps or etch steps), the present disclosure is not limited thereto. For example, one or more hardmasks (including one or more layers) may be patterned to define various regions for subsequent process steps to be applied (e.g., regions for receiving dopant atoms, regions to block etchants). Moreover, the resist layers may include multi-level resists instead of a single-level resist in some examples. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A semiconductor device, comprising:
a substrate including a body region having a first conductivity type and a drift region having a second conductivity type opposite the first conductivity type;
a gate dielectric layer on the substrate, the gate dielectric layer extending over the body region and the drift region;
a field relief dielectric layer on the drift region, the field relief dielectric layer laterally abutting the gate dielectric layer at a location over the drift region;
a gate electrode on the gate dielectric layer and the field relief dielectric layer, the gate electrode including;
a first portion with the second conductivity type, and extending over the body region and a first part of the drift region;
a second portion with the first conductivity type, abutting the first portion, and extending over a second part of the drift region and a first part of the field relief dielectric layer, the second portion having a center midline approximately corresponding to an intersection point between the gate dielectric layer and the field relief dielectric layer at the location over the drift region; and
a third portion with the second conductivity type, abutting the second portion, and extending over a second part of the field relief dielectric layer;
a source region disposed in the body region, the source region having the second conductivity type; and
a drain region disposed in the drift region, the drain region having the second conductivity type.

2. The semiconductor device of claim 1, wherein a width of the second portion of the gate electrode is at least twice a thickness of the gate electrode, the width corresponding to a distance between the first portion and the third portion of the gate electrode.

3. The semiconductor device of claim 1, wherein a width of the second portion of the gate electrode is greater than 300 nanometers, the width corresponding to a distance between the first portion and the third portion of the gate electrode.

4. The semiconductor device of claim 1, wherein the second portion of the gate electrode is degenerately doped or has an active average dopant density greater than $1 \times 10^{19}/cm^3$.

5. The semiconductor device of claim 1, wherein the field relief dielectric layer includes silicon dioxide of a local oxidation of silicon (LOCOS) layer.

6. The semiconductor device of claim 1, wherein the first conductivity type is p-type and the second conductivity type is n-type.

7. The semiconductor device of claim 1, wherein the gate electrode has a racetrack layout.

8. The semiconductor device of claim 1, wherein:
the gate dielectric layer has a first thickness; and
the field relief dielectric layer has a second thickness greater than the first thickness.

9. The semiconductor device of claim 1, wherein:
the source region has a first average dopant density greater than a second average dopant density of the body region; and
the drain region has the first average dopant density greater than a fourth average dopant density of the drift region.

10. The semiconductor device of claim 1, further comprising:

a back-gate region disposed in the body region, the back-gate region having the first conductivity type, wherein the back-gate region is electrically isolated and separated from the source region.

11. The semiconductor device of claim 1, wherein the field relief dielectric layer is a shallow trench isolation structure at least partially disposed within the substrate.

12. The semiconductor device of claim 1, further comprising a sidewall spacer disposed along a sidewall of the gate electrode; and wherein the first portion of the gate electrode extends laterally from the sidewall spacer to over the body region and the first part of the drift region such that the first portion of the gate electrode extends laterally over more of the first part of the drift region than the body region.

13. A method, comprising:

forming a field relief dielectric layer on a substrate;

forming a body region and a drift region in the substrate, the body region having a first conductivity type and the drift region having a second conductivity type opposite the first conductivity type;

forming a gate dielectric layer on the substrate, the gate dielectric layer extending over the body region and the drift region, the gate dielectric layer laterally abutting the field relief dielectric layer at a location over the drift region;

forming a gate electrode on the gate dielectric layer and the field relief dielectric layer, the gate electrode including;

a first portion with the second conductivity type, and extending over the body region and a first part of the drift region;

a second portion with the first conductivity type, abutting the first portion, and extending over a second part of the drift region and a first part of the field relief dielectric layer, the second portion having a center midline approximately corresponding to an intersection point between the gate dielectric layer and the field relief dielectric layer at the location over the drift region; and a third portion with the second conductivity type, abutting the second portion, and extending over a second part of the field relief dielectric layer;

forming a source region in the body region, the source region having the second conductivity type; and forming a drain region in the drift region, the drain region having the second conductivity type.

14. The method of claim 13, wherein a width of the second portion of the gate electrode is at least twice a thickness of the gate electrode, the width corresponding to a distance between the first portion and the third portion of the gate electrode.

15. The method of claim 13, wherein the second portion of the gate electrode is degenerately doped or has an active average dopant density greater than $1\times10^{19}/cm^3$.

16. The method of claim 13, further comprising:

forming a back-gate region in the body region, the back-gate region having the first conductivity type, wherein the back-gate region is electrically isolated and separated from the source region.

17. The method of claim 16, wherein forming the back-gate region includes forming the second portion of the gate electrode.

18. A semiconductor device, comprising:

a substrate including a p-type body region and an n-type drift region;

a first dielectric layer on the substrate, the first dielectric layer extending over the p-type body region and the n-type drift region;

a second dielectric layer on the n-type drift region, the second dielectric layer having a thickness greater than the first dielectric layer, and laterally abutting the first dielectric layer at a location over the n-type drift region;

a gate electrode on the first dielectric layer and the second dielectric layer, the gate electrode including;

an n-type first portion extending over the p-type body region and a first part of the n-type drift region;

a p-type second portion abutting the n-type first portion, and extending over a second part of the n-type drift region and a first part of the second dielectric layer, the p-type second portion having a center midline approximately corresponding to an intersection point between the first dielectric layer and the second dielectric layer at the location over the n-type drift region; and an n-type third portion, abutting the p-type second portion, and extending over a second part of the second dielectric layer;

an n-type source region disposed in the p-type body region; and an n-type drain region disposed in the n-type drift region.

19. The semiconductor device of claim 18, wherein the p-type second portion of the gate electrode has an active average dopant density greater than $1\times10^{19}/cm^3$.

20. The semiconductor device of claim 18, wherein:

the second dielectric layer is a local oxidation of silicon (LOCOS) layer including a bird's beak; and the bird's beak terminating at the intersection point between the first dielectric layer and the second dielectric layer.

* * * * *